United States Patent [19]

Hartman et al.

[11] Patent Number: 4,641,426
[45] Date of Patent: Feb. 10, 1987

[54] SURFACE MOUNT COMPATIBLE CONNECTOR SYSTEM WITH MECHANICAL INTEGRITY

[75] Inventors: John E. Hartman, Painesville; John T. Venaleck, Madison, both of Ohio

[73] Assignee: Associated Enterprises, Inc., Painesville, Ohio

[21] Appl. No.: 747,343

[22] Filed: Jun. 21, 1985

[51] Int. Cl.$^4$ .......................... H05K 3/30; H01R 9/00
[52] U.S. Cl. .................................. 29/839; 339/198 H; 339/275 B; 228/180.1
[58] Field of Search ................. 29/837, 839, 840, 843, 29/845; 339/198 G, 198 H, 275 R, 275 B, 17 C, 176 MP; 228/180.1, 248

[56] References Cited

U.S. PATENT DOCUMENTS

| | | | |
|---|---|---|---|
| 3,834,015 | 9/1974 | Di Renzo | 29/843 |
| 3,864,014 | 2/1975 | Lynch | 339/275 R |
| 3,905,665 | 9/1975 | Lynch et al. | 339/275 B X |
| 3,932,934 | 1/1976 | Lynch et al. | 29/843 |

*Primary Examiner*—Howard N. Goldberg
*Assistant Examiner*—Carl J. Arbes
*Attorney, Agent, or Firm*—Renner, Otto, Boisselle & Lyon

[57] ABSTRACT

An electrical component for mechanical mounting and electrical connection with respect to plated through holes of a printed circuit board compatibly with a surface mount attaching process includes an electrically non-conducting body, plural generally elongate contacts extending from the body for insertion into such plated through holes, and the component having a reservoir for retaining solder type material for melting, for flow into respective plated through holes, and for re-solidifying mechanically and electrically to couple the component to such printed circuit board. Preferably the component is a connector, such as a header, and the contact pins or leads thereof provide interface connection between the printed circuit board and a separate or portable connector.

A method for attaching such an electrical component to a printed circuit board compatibly with surface mount attaching processes and an apparatus to carry out such method also are part of the invention.

31 Claims, 12 Drawing Figures

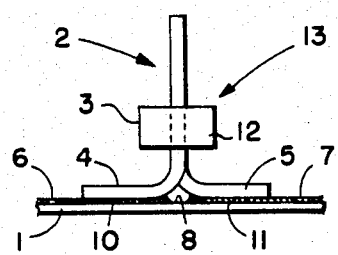
PRIOR ART
Fig. 1A
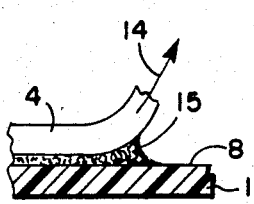
PRIOR ART
Fig. 1B
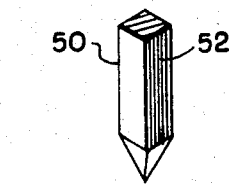
Fig. 5
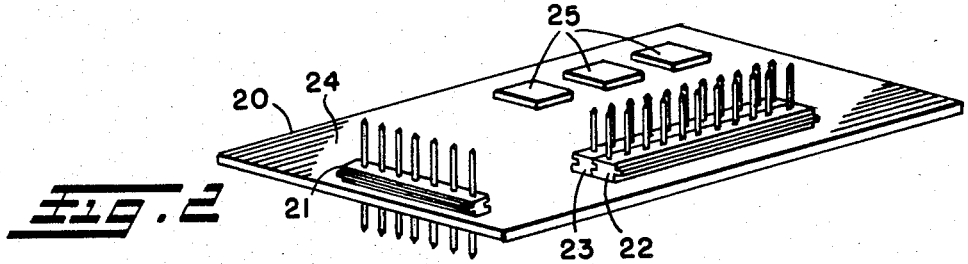
Fig. 2
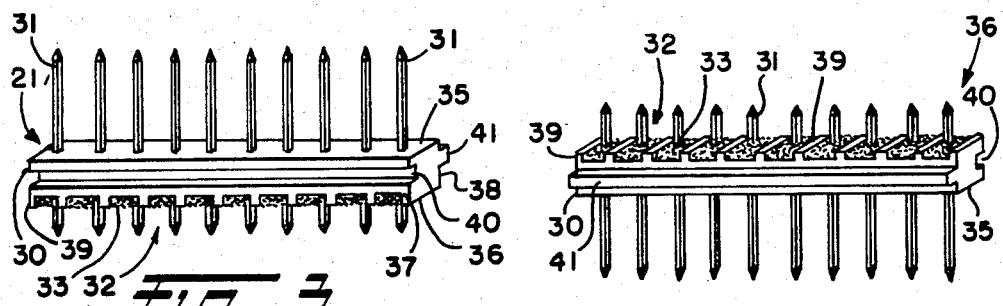
Fig. 3
Fig. 4
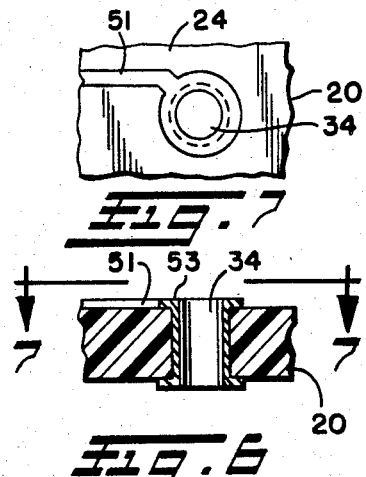
Fig. 7
Fig. 6
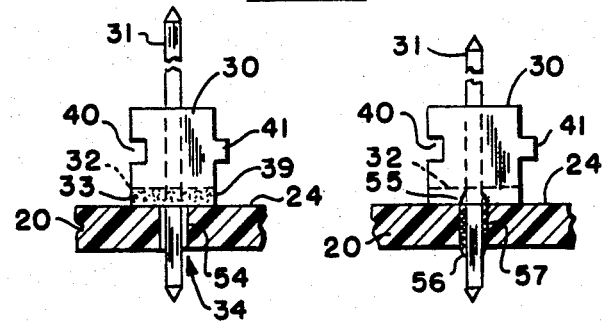
Fig. 8
Fig. 9

4,641,426

SURFACE MOUNT COMPATIBLE CONNECTOR SYSTEM WITH MECHANICAL INTEGRITY

TECHNICAL FIELD

This invention relates generally to surface mount electrical component/printed circuit board apparatus and processes, and, more particularly, to electrical connectors compatible for use in the manufacturing and operation of surface mount apparatus.

BACKGROUND

Surface mount technology in the field of electronics is that in which electrical components are mounted directly to the surface of a printed circuit board or the like usually without any contacts or leads penetrating through the printed circuit board. Increased space utilization efficiency is an advantage of surface mount technology over space requirements of the prior art techniques for mounting electrical components on a printed circuit board. Thus, surface mount technology provides increased density of components and/or increased capabilities for a given printed circuit board and the like; and surface mount technology also generally reduces the height above board requirements and, therefore, allows more printed circuit boards to be stacked or otherwise positioned in a given electrical apparatus.

In typical surface mount processes a surface mount electrical component is mounted directly to a printed circuit board. More specifically, the printed circuit board may have circuit traces and contact/mounting pads all printed on a surface thereof. A surface mount electrical component, such as a leaded chip carrier, an unleaded component, or the like, having plural leads, terminal pads, or the like, is placed on such contact-/mounting pads. Solder may have been applied to such leads, terminal pads and/or contact/mounting pads prior to such placement. After all such components are placed on the printed circuit board, heat energy is applied to reflow the solder, such as vapor phase soldering, to complete electrical and mechanical connections between the component(s) and the contact/mounting pads and traces of the printed circuit board. Sometimes an adhesive material is used temporarily to hold the component(s) in position on the printed circuit board prior to and during such soldering.

Consistent with the surface mounting processes currently employed, electrical connectors have been mounted directly to the surface of the printed circuit board in substantially the same way as the other surface mount components are mounted, as is summarized above. In this way complete compatability of mounting processes is achieved. An example of such an electrical connector is a device known as a header, which is a plurality of electrical contacts retained in relative position by an electrically non-conductive body. Typically such contacts are elongate pin type contacts with ends that are exposed at opposite sides, e.g. the top and bottom, of the body. The exposed contact ends remote from the body are of a shape and are so positioned to fit into electrical and mechanical engagement with the contacts of a portable connector which may be inserted over such contact ends. Such a portable connector may be a female connector having plural female contacts for engaging the male contacts of the header to provide electrical connection of respective circuits, e.g. to the conductors of a cable, another printed circuit board or the like. One or more headers may be mounted in side-by-side fashion to provide multiple rows of exposed header contacts for connection to the contacts of appropriately designed portable connectors and the like.

For consistency with surface mount processes it has become practice to bend the exposed ends of the connector, e.g. header, contacts that are proximate the printed circuit board so that such contact ends can lay flat against the contact/mounting pads of the printed circuit board. Then, during the surface mounting soldering process, securement of those contact ends mechanically and electrically to the surface of the printed circuit board is accomplished in the same way that securement of the other surface mount components is accomplished.

However, such connector surface mounting process lacks certain strength and durability characteristics over prior through-the-board mounting techniques for mounting components on a printed circuit board. Specifically, whenever a portable connector is removed from the header/connector, a substantial force is applied to the connection of the contacts and pads to which they are attached; indeed, such pads themselves are not integral with the printed circuit board but are only an additional layer applied thereto. Thus, there is the possibility that the connection of the header to the printed circuit board and/or the integrity of the pads and printed circuit traces will be too easily damaged or destroyed when mechanically stressed by removing a portable connector from connection with the header connector.

Another disadvantage with the technique of using bent contacts to make connections between a connector mounted on a surface mount printed circuit board and the contact/terminal pads of the latter is the relatively large amount of space required for such contacts and the connections thereof to the printed circuit board. Such space requirement is contrary to one of the important advantages of the surface mount technique vis-a-vis other electrical components designed specifically to be space efficient in the surface mounting process.

BRIEF SUMMARY OF THE INVENTION

According to the present invention an electrical component that has plural elongate leads or contacts is mountable and/or mounted in a printed circuit board compatibly with surface mount processes by placing the leads or contacts in plated through holes of the printed circuit board and effecting soldering function contemporaneously with the soldering effected during the surface mount soldering process. The leads or contacts in the holes increase the mechanical strength of attachment of the component to the printed circuit board.

According to one aspect of the invention, an electrical component for mechanical mounting and electrical connection with respect to plated through holes of a printed circuit board compatibly with a surface mount attaching process includes an electrically non-conducting body, plural generally elongate contacts extending from the body for insertion into such plated through holes, and the component having a reservoir for retaining solder type material for melting, for flow into respective plated through holes, and for re-solidifying mechanically and electrically to couple the component to such printed circuit board. Preferably the noted reservoir includes solder material for reflowing during the process in which the surface mount components are soldered to the printed circuit board.

According to another aspect of the invention, a method for attaching an electrical component to a printed circuit board compatibly with surface mount attaching processes, such printed circuit board having electrically conductive traces and plated through holes, such component having generally linearly extending contacts and a reservoir of solder type material, includes inserting linearly extending contacts of such component through respective plated through holes while positioning such reservoir of solder type material in proximity to such holes, applying thermal energy to melt such solder type material to flow into such respective holes, and allowing such solder type material to solidify to form a mechanical and electrical connection of respective contacts in respective plated thorugh holes. Such method is particularly useful in automated, e.g. robotic, manufacturing processes.

According to a further aspect of the invention, an apparatus for automatically assembling an electrical component on a printed circuit board compatibly with surface mount attaching processes, such printed circuit board having plated through holes, and such component having generally elongate contacts adapted to be placed into such holes and a reservoir of solder type material for mechanically and electrically attaching respective contacts at respective holes, includes a holder for holding a plurality of such components in stacked relation, a slider for sliding a component from such holder into accessible pick up position, and a robotic device for picking up such component, transferring such component to a printed circuit board, and inserting such contacts into such holes with such solder type material placed in proximity to such holes.

In one embodiment the electrical component is a header having plural elongate parallel pin type contacts held in an electrically non-conductive body. The pins are inserted through plated through holes in the printed circuit board, e.g. using robotics, while leaving some space between the respective pins and hole walls. A supply of solder type material about each pin and at least partly in a recess forming a reservoir in the body is meltable to fill up space left in each hole thus providing both mechanical securement and electrical connection between the contacts and the holes. Such recesses may be formed by respective pairs of stand off protrusions of the header body that prevent the main part of the body from directly engaging the surface of the printed circuit board and/or provide other functions, as is described further below. The mechanical and electrical integrity of such connector/printed circuit board connection ordinarily is at least as good and preferably better than is achieved using the prior bent contact surface mount attachment technique summarized above; and the technique of the invention also minimizes the amount of space required on the printed circuit board for attaching the header connector thereto. Furthermore, since there is no need for bent contacts, the additional height above board requirement therefor is eliminated, this being further consistent with the philosophy of surface mount technology.

These and other objects, aspects, and advantages of the present invention will become more apparent as the following description proceeds.

To the accomplishment of the foregoing and related ends, the invention, then, comprises the features hereinafter fully described in the specification and particularly pointed out in the claims, the following description and the annexed drawings setting forth in detail a certain illustrative embodiment of the invention, these being indicative, however, of but one of the various ways in which the principles of the invention may be suitably employed.

BRIEF SUMMARY OF THE DRAWINGS

In the annexed drawings:

FIGS. 1A and 1B are views of a prior art surface mounted connector on a printed circuit board, respectively depicting a header so mounted and an enlargement of one of the header bent contacts showing the forces applied during removal of a portable connector;

FIG. 2 is an isometric view of a printed circuit board with electrical components in the form of headers mounted thereon in accordance with the present invention with other surface mount components—the stand offs on the header bodies are not shown in this figure for facility and clarity;

FIGS. 3 and 4 are, respectively, top and bottom isometric views of a header connector component in accordance with the present invention;

FIG. 5 is an enlarged fragmentary isometric view of a pin contact of the header connector component in accordance with the present invention;

FIG. 6 is an enlarged fragmentary section view of a plated through hole of the printed circuit board of FIG. 2;

FIG. 7 is a top view of the plated through hole of FIG. 6 looking generally in the direction of the arrows 7—7 of FIG. 6;

FIG. 8 is an enlarged fragmentary section view of the header positioned in the printed circuit board prior to soldering;

FIG. 9 is an enlarged fragmentary section view of the header positioned in the printed circuit board after soldering;

PRIOR ART

Figure 10:
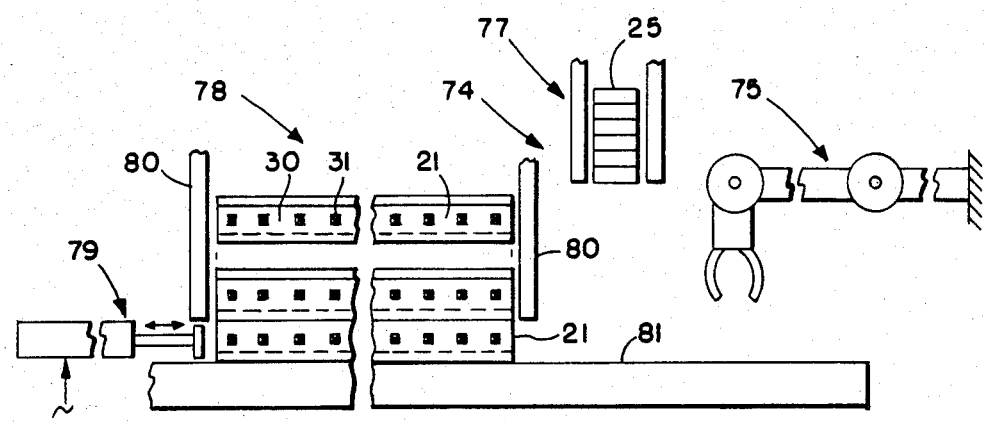
FIG. 10 is a schematic view of an automated machine for placing surface mount components in a printed circuit board.

Briefly referring to FIGS. 1A and 1B, a printed circuit board 1 on which surface mount components are to be mounted and on which an electrical connector 2 in the form of a header 3 with bent contacts 4, 5 is illustrated. The printed circuit board 1 has plural printed circuit traces 6, 7 printed or otherwise formed on the surface 8 thereof, each preferably having one or more mounting pads sometimes called solder pads 10, 11 electrically connected therewith and on which a surface mount component may be mounted and electrically connected. The header 3 is formed of a body 12 of electrically non-conductive material that preferably is molded about a portion of each of the contacts 4, 5 to hold the same in the parallel alignment shown at available contacting portions 13 while also maintaining the bent contact ends 4, 5 in position to be attached to respective pads 10, 11.

With the header 3 in position on the printed circuit board 1 the header and other surface mount components may be vapor phase or otherwise soldered in place. The relatively large amount of space required by the contacts 4, 5 on the surface 8 of the printed circuit board 1 is evident from FIGS. 1A and 1B; to avoid breaking the contacts 4, 5 it is necessary that the curvature thereof be somewhat gradual and, therefore, more space consuming. In FIG. 1B the force applied to the contact 4 of the header 3 is represented generally by the vector 14 which can be resolved to a substantial vertical force concentration that tends to tear at the solder 15 in a direction in which there is a weakness in the solder, e.g. the solder is thin and there is minimal grasping force of the contact 4 in such direction, and in the pad 10 and a horizontal force component. Indeed, such tearing action can too easily damage the integrity of the connection between the contact 4 and the pad 10 and possibly also can damage the integrity of the pad vis-a-vis connection to the surface 8.

DESCRIPTION OF THE PREFERRED EMBODIMENT

Referring now in detail to the drawings showing the invention, wherein like numerals designate like parts in the several figures, and initially to FIG. 2, a printed circuit board 20 having a single header 21 and a pair of parallel headers 22, 23 mounted thereon is illustrated. Also mounted on the printed circuit board surface 24 are several surface mount electrical components 25, such as leaded or unleaded chip carriers, etc.

The fundamental components of the invention, such as an electrical component in the form of the header 21, of the invention include an electrically non-conductive body 30, one and preferably a plurality of electrical leads 31 supported by or protruding from such body, and a reservoir 32 formed in the body for retaining or helping to retain a quantity of solder or solder type material 33, all of which are illustrated in FIGS. 3 and 4. Moreover, the invention also relates to respective plated through holes 34 (FIG. 6) through the printed circuit board 20 and through which respective electrical leads 31 pass to complete a connection of a header to the printed circuit board.

The body 30 is of electrically non-conductive material capable of withstanding the temperatures and other environmental conditions experienced during the process by which the surface mount components are secured to the printed circuit board, e.g. during a vapor phase soldering process, etc. Such temperatures and environmental conditions may be more severe than those experienced in the past using conventional wave soldering techniques wherein the heat of the solder wave usually is kept remotely from the components, i.e. on the opposite side of the printed circuit board from the component.

Preferably the body 30 is of rectangular cross section having top and bottom surfaces 35, 36 through which the leads, in the form of pin contacts 31, protrude or extend, and side surfaces 37, 38. In the bottom surface 36 are the reservoirs 32 within which the solder supply 33 is retained. The reservoirs 32 are recesses formed between respective pairs of stand off protrusions 39 that extend from the surface 36, such reservoirs, then, generally circumscribing the areas where the respective pin contacts protrude out from the surface 36. Alternatively, the reservoirs may be formed of raised ring-like or other shape walls and/or recesses formed on the bottom surface 36 of the body 30.

To facilitate automated handling of the headers 21, 22, 23 (FIG. 2) the side surfaces 37, 38 preferably are of a shape that permits one surface to slide along the other. More specifically, the surfaces 37, 38 are generally smooth except for a groove 40 formed in the surface 37 and a flange, tab or tongue 40 formed in the surface 38. The tab of one header may slide in the groove of an adjacent one to facilitate the mentioned automated handling, as is described further below. Such tab and groove arrangement also may help to secure the two headers 22, 23 (FIG. 2) with respect to each other to reinforce their retention on the printed circuit board 20.

The pin contacts 31 preferably are elongate, most preferably they are straight, although special curvature at appropriate locations may be included, if desired, for example to help retain the same in the body 30 or for other mechanical or electrical connection purpose. The pin contacts 31 extend beyond the top of the header body 30 a distance adequate to facilitate secure attachment to respective female contacts or the like thereto, as is shown at 31T, and the pin contacts 31 extend beyond the bottom of the header an adequate distance to pass through the plated through holes 34, as is shown at 31B. The cross section of the pin contacts or leads 31 may be is rectangular, for example square; alternatively, they may be generally circular. A rectangular cross section, though, ordinarily provides greater strength than round cross section. It will be appreciated that since the pin contacts do not have to bend to the extent that the leads 4, 5 (FIG. 1A) are bent, such pin contacts 31 do not have to be as long as those leads 4, 5, thus further reducing cost and importantly reducing space requirements in directions parallel to the plane of the printed circuit board 20 and through the printed circuit board.

In FIGS. 6 and 7 the plated through holes 34 are shown. Such holes are through the printed circuit board 20, are plated, and preferably are coupled electrically to printed circuit traces 51 on the printed circuit board in usual manner. The relation of the cross sectional size or dimension of the plated through holes to that of the pin contacts is such that will minimize, indeed preferably will avoid any, insertion forces of the pin contacts 31 into the board 20 and facilitate pin to hole alignment during manufacturing, which may be particularly advantageous when using automated, e.g. robotic, manuracturing techniques. The noted cross sectional relation is such that there is at least some space between part of the faces 52 of the pin contacts 31 and the sides 53 of the holes. Such space 54 is provided to permit the flow of solder therein, e.g. when the solder type material 33 is reflowed during the surface mount process.

Placement of the header 21 in the printed circuit board 20 is shown in enlargement in FIGS. 8 and 9, the former before soldering and the latter afterwards. The bottom end of the pin contact 31 is inserted into the plated through hole 34 to such extent that preferably the solder supply 33 is in engagement with the printed circuit board top surface or with the plated through hole and/or adjacent trace printed thereon. On one hand, the recessed area in the header body 30 between stand offs provides the reservoir 32 and allows a relatively large amount of solder, in any event the amount needed to complete a secure soldering process while permitting the body to be positioned rather close to the top surface of the printed circuit board to minimize height above board requirements and to maximize strength parameters. On the other hand, the stand offs provide space above board to permit cleaning of the board surface to remove residual flux from the solder surfaces. The open areas between stand offs also may improve heat penetration to the solder supply to melt the same, and to assure melted solder flows to proper locations, i.e. down the hole and to form the desired meniscus 55 and meniscus 56, as is seen in FIG. 9, without causing any short circuiting to other pin contacts, printed circuit traces, etc. The stand offs 39 themselves also may help prevent short circuiting between adjacent pin contacts 31 and of the circuits to which they may be connected.

The solder supply 33 may be an electronic solder paste, such as that sold by Alpha Metals Inc., Jersey City, N.J., U.S.A. that can be placed in the reservoirs 32 between respective stand offs 39, for example by using a syringe type device. Such solder paste may be cured in usual fashion, e.g. by heat, to prevent the same from being sticky and, thus, to facilitate shipping and handling and to extend shelf life.

Summarizing installation of the header 21 in the printed circuit board 20, the header pin contacts 31 are inserted into respective plated through holes. The solder supply 33 in each reservoir 32 is heated, melts and by capillary action, gravity, etc. flows into the space 54 and then solidifies.

In FIG. 9 the reflowed solder 57 can be seen filling the space 54 and also forming the meniscus 55 at the top of the printed circuit board and the further meniscus 56 at the bottom of the hole in the printed circuit board. Each meniscus helps to assure effective electrical connection, provides some degree of compliance factor as parts mechanically are bent, stressed, etc., and tends to maintain cleanliness of the areas where the majority of the pin contacts, plating in the plated through holes, and solder engaged with both of the latter are mechanically and electrically coupled. Preferably the quantity of the solder supply 33 in each reservoir 32 is adequate when reflowed to fill the space 54 and to form te menisci 55, 56 extending along the pin contact 31 beyond the plane of the board 20 at the top and bottom surfaces thereof for the aforementioned reasons, i.e. to achieve the above advantages of the invention. Too little solder may result in the space 54 not being filled and/or one or both of the menisci being too short or even recessed within the hole 34.

The aforementioned reflowing of the solder may be achieved using vapor phase soldering or other technique employed for surface mount electrical and mechanical attachment processes vis-a-vis surface mount electrical components and printed circuit boards or the like intended to carry the same.

An important advantage to the aforementioned solder supply 33 and reservoir 32 therefor is that since the solder material is provided in a reservoir on the connector or other electrical component, i.e. the header 21, rather than as a coating or layer on the pin contact or on the plating of the plated through hole, the possibility of scraping away the solder during insertion of the pin contact into the hole is avoided. Moreover, such reservoir of solder preferably permits adequate amount thereof to be carried for filling the space 54 for strength and integrity of the mechanical and electrical connections to be made.

An automated apparatus for assembling printed circuit boards with surface mount components is shown schematically at 70 in FIG. 10. Such machine includes a support 71 for a printed circuit board, with conventional alignment mechanism for placing, loading, and/or holding the board 20 in proper alignment. An exemplary support for the board 20 is shown at 72. The machine 70 also includes a supply 74 of surface mount components and/or other electrical and electronic components, a robotic mechanism 75, such as a robotic arm with appropriate movement and retention capabilities, and a controller 76. The controller 76 may be a computer control device of conventional design programmed in conventional manner to operate the supply 74 to provide surface mount components for pick up and delivery to the printed circuit board 20 by the robotic arm 75 and, of course, also to operate such arm. Such apparatus may be generally of the type that is employed in automated surface mount manufacturing processes, and operation of such apparatus may be generally as is conventional for such apparatus as used in surface mount manufacturing processes.

The supply 74 includes, for example, a supply of conventional surface mount components, such as PLCC (plastic leaded or unleaded chip carrier) and/or other devices in a holder, all generally designated 77, and a further holder 78 for containing a supply of a plurality of headers 21 in stacked relation. Associated with the holder 78 is a pusher 79 for pushing a header 21 out from between guides 80 along a table 81 into position for pick up by the arm 75 both under operative control of the controller 76. Since the side surfaces of the header bodies 30 are smooth or in any event designed to slide over each other and especially in view of the tab 40 and groove 41 configuration thereof, such sliding in an accurately determined manner can be accomplished to facilitate use with and positioning by the automated apparatus 70. Thus, upon being picked up by the robotic arm 75, the header may be conveniently rotated by the arm and is placed properly in the plated through holes provided therefor in the printed circuit board 20.

Figure 11:
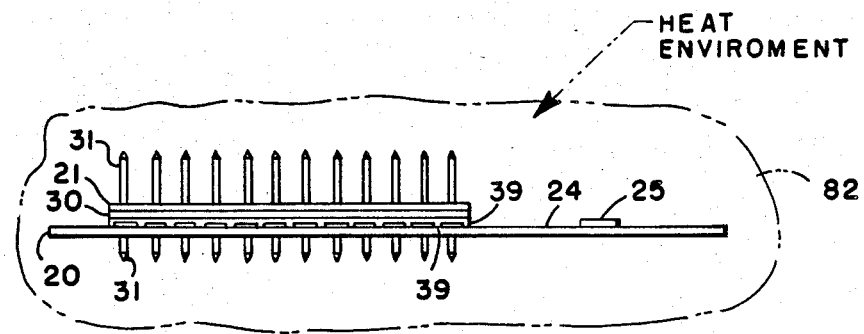
FIG. 11 is a schematic view of a vapor phase solder environment in which soldering of surface mount and connector components according to the invention may be carried out.

Briefly referring to FIG. 11, the assembled printed circuit board 20 with several surface mount electrical components, such as PLCC and header/connector devices, positioned thereon is shown placed in a heated environment 82 in which vapor phase soldering of such components and printed circuit board can be accomplished in conventional manner. During such soldering, solder already pre-placed on the printed circuit board and/or on the components (ordinarily except for the header or other components that are to be secured to the printed circuit board in the manner described in detail above with respect to the header 21) will be reflowed to complete mechanical and electrical connections. Also during such soldering the solder supply 33 will reflow in the manner described above to complete the connections shown in detail in FIG. 9. It will be appreciated that if desired there may be a pre-placement of solder at the plated through holes 34 and/or on the pin contacts 31 while realizing that some of such solder likely would be pushed out or scraped off when the pin contacts 31 are pushed into the holes. It also will be appreciated that other surface mount components may be mechanically and electrically connected to a printed circuit board in the manner described with respect to the header 21 while still maintaining the space efficiency aspects of surface mount technology and processes.

In view of the foregoing, it will be appreciated that the invention may be used to secure mechanically and electrically electrical components, such as connectors, more particularly headers, and the like to printed circuit boards or other surfaces or supports for such components in a way that is compatible with surface mount processes and while maintaining the space utilization efficiency offered by surface mount technology.

What is claimed is:

1. An electrical component for mechanical mounting and electrical connection with respect to plated through holes of a printed circuit board compatibly with a surface mount attaching process, comprising
   an electrically non-conducting body, and
   plural generally elongate contact means extending from said body for insertion into such plated through holes, and
   said component having reservoir means for retaining solder type material for melting, for flow into respective plated through holes, and for re-solidifying to mechanically and electrically couple said component to such printed circuit board, and said reservoir means comprising a reservoir in said body.

2. The component of claim 1, said reservoir comprising recesses in a surface of said body proximate locations where respective contact means extend out from said body.

3. The component of claim 2, wherein each of said recesses is formed by a pair of stand off protrusions protruding from said body between respective pairs of contact means.

4. The component of claim 3, said component comprising a header and said contact means comprising elongate pin type contacts extending linearly through said body in parallel relation to each other.

5. The component of claim 4, wherein said body has a rectangular cross section and said contacts extend generally in parallel to two surfaces to said body.

6. The component of claim 4, said solder type material comprising a paste like material cured to at least substantially solid state.

7. The component of claim 1, said solder type material comprising a paste like material cured to at least substantially solid state.

8. The component of claim 1, said component comprising a header including said body and said contact means comprising elongate pin type contacts extending linearly through said body in parallel relation to each other.

9. The component of claim 8, said body of said header comprising an elongate body in one direction, said contacts being positioned to extend generally in parallel relation through said elongate body perpendicularly to the direction of body elongation.

10. The component of claim 9, said elongate body having a pair of opposite surfaces capable of smoothly sliding across respective opposite surfaces of another header.

11. The component of claim 8, wherein said body has a rectangular cross section and said contacts extend generally in parallel to two surfaces to said body.

12. The component of claim 8, said contacts having a rectangular cross section that fits smoothly into such plated through holes in such printed circuit board.

13. The component of claim 12, said contacts being of a shape to permit space to exist between part of said contacts and plating in such plated through holes, and said solder type material is of a quantity and consistency to flow into and to fill such space when melted.

14. The component of claim 1, said component comprising an electrical connector including said body and said body holds said plural contact means in relative position to each other.

15. The component of claim 14, said component comprising a header, said contact means comprising plural parallel positioned contacts held by said body to form said header.

16. An electrical header for mechanical mounting and electrical connection with respect to plated through holes of a printed circuit board compatibly with a surface mount attaching process, comprising
    an electrically non-conducting, elongate body having a pair of opposite surfaces capable of smoothly sliding across respective opposite surfaces of another header, a groove on one of said opposite surfaces and a slot in the other of said surfaces for maintaining parallel alignment of respective headers during such sliding, and
    plural generally elongate contact means extending from said body for insertion into such plated through holes, said contact means comprising elongate pin type contacts positioned to extend generally in parallel relation to each other and linearly through said elongate body perpendicularly to the direction of body elongation, and
    said header having reservoir means for retaining solder type material for melting, for flow into respective plated through holes, and for re-solidifying mechanically and electrically to couple said component to such printed circuit board.

17. An electrical component for mechanical mounting and electrical connection with respect to plated through holes of a printed circuit board compatibly with a surface mount attaching process, comprising:
    plural generally elongate contacts,
    body means for holding said contacts with portions thereof spaced apart and extending in generally parallel relationship from a bottom surface of said body means for insertion into such plated through holes, said bottom surface having plural recesses proximate locations where respective contacts have said portions thereof extending from said body means, and
    respective solder supplies received in said recesses for melting, flow into respective plated through holes and re-solidifying mechanically to mount and electrically to connect said component with respect to such printed circuit board.

18. The component of claim 17, wherein relatively adjacent ones of said recesses define therebetween a protrusion on said body means which separates solder supplies at each side thereof from one another.

19. The component of claim 17, wherein each of said recesses is formed by a pair of stand off protrusions interposed between the contacts of respective pairs thereof.

20. An electrical component for mechanical mounting and electrical connection with respect to plated through holes of a printed circuit board compatibly with a surface mount attaching process, comprising:
    plural generally elongate contacts;
    body means for holding said contacts with portions thereof spaced apart and depending in generally parallel relationship from said body means for insertion into and locating of first parts thereof coextensively with such plated through holes, said contacts also having second parts located above said first parts; and
    solder supply means for melting, flow into respective plated through holes and re-solidifying mechanically to mount and electrically to connect said component with respect to such printed circuit board; and said component including as an integral part thereof means for holding said solder supply means coextensively with said second parts of said contacts and against movement relative to said portions of said contacts until melted for flow into the plated through holes.

21. The component of claim 20, wherein said body means includes laterally spaced-apart, depending protrusions for engaging the printed circuit board to provide space between said body means and the printed circuit board.

22. A method for attaching an electrical component to a printed circuit board compatibly with surface mount attaching processes, such printed circuit board having electrically conductive traces and plated through holes, such component having generally linearly extending contacts and a reservoir of solder type material, comprising
   using automated equipment to position such component with respect to such printed circuit board and to insert linearly extending contacts of such component into respective plated through holes in such printed circuit board while positioning such reservoir of solder type material in proximity to such holes,
   applying thermal energy to melt such solder type material to flow into such respective holes, and
   allowing such solder type material to solidify to form a mechanical and electrical connection of respective contacts in respective plated through holes.

23. The method of claim 22, wherein such component is a header.

24. The method of claim 22, wherein said component is an electrical connector.

25. The method of claim 22, wherein such contacts have a generally rectangular cross section and such holes have a generally round cross section.

26. The method of claim 25, wherein such solder type material is permitted to flow into and to fill space in such holes.

27. The method of claim 26, wherein such solder type material flows to form a meniscus along such contacts and between the latter and the surface of such printed circuit board.

28. The method of claim 22, wherein such solder type material is permitted to flow into and to fill space in such holes.

29. The method of claim 28, wherein such solder type material flows to form a meniscus along such contacts and between the latter and the surface of such printed circuit board.

30. The method of claim 22, wherein such component is a connector, and further comprising automatically supplying such connectors to such automated equipment from an automatic feeder.

31. The method of claim 30, wherein such connector is a header, and such feeder is a holder for holding plural headers in stacked relation with such contacts generally positioned in parallel relation, and said automatically supplying comprises sliding at least one header from such stack for delivery by such automated equipment to such printed circuit board.

* * * * *